US012670961B2

(12) United States Patent
Papagianni et al.

(10) Patent No.: US 12,670,961 B2
(45) Date of Patent: Jun. 30, 2026

(54) NAND DETECT EMPTY PAGE SCAN USING SUBSETS OF WORDLINES ON A PAGE

(71) Applicant: Micron Technology, Inc., Boise, ID (US)

(72) Inventors: Christina Papagianni, San Jose, CA (US); Murong Lang, San Jose, CA (US); Peng Zhang, Los Altos, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 644 days.

(21) Appl. No.: 17/898,043

(22) Filed: Aug. 29, 2022

(65) Prior Publication Data

US 2024/0071514 A1    Feb. 29, 2024

(51) Int. Cl.
| *G11C 16/16* | (2006.01) |
| *G11C 7/04* | (2006.01) |
| *G11C 13/00* | (2006.01) |
| *G11C 16/08* | (2006.01) |
| *G11C 16/34* | (2006.01) |

(52) U.S. Cl.
CPC ................ *G11C 16/16* (2013.01); *G11C 7/04* (2013.01); *G11C 13/0035* (2013.01); *G11C 16/08* (2013.01); *G11C 16/3404* (2013.01); *G11C 16/3495* (2013.01)

(58) Field of Classification Search
CPC ....... G11C 16/16; G11C 7/04; G11C 13/0035; G11C 16/08; G11C 16/3404; G11C 16/3495; G11C 11/5635; G11C 16/0483
See application file for complete search history.

(56) References Cited

U.S. PATENT DOCUMENTS

| 2019/0189202 A1* | 6/2019 | Avraham | ........... | G11C 16/3418 |
| 2021/0193229 A1* | 6/2021 | Liikanen | ............. | G11C 29/021 |
| 2022/0004336 A1* | 1/2022 | Naghate | ................. | G11C 16/32 |
| 2023/0022639 A1* | 1/2023 | Lee | ......................... | G11C 16/16 |
| 2023/0402113 A1* | 12/2023 | Miwa | ..................... | H10B 43/27 |
| 2024/0047000 A1* | 2/2024 | Song | ...................... | G11C 16/16 |

* cited by examiner

*Primary Examiner* — Donald HB Braswell
(74) *Attorney, Agent, or Firm* — Harrity & Harrity, LLP

(57) ABSTRACT

A controller of a memory device may identify a plurality of word line groups, included in a block of a memory of the memory device, that include erased pages of the block. The controller may identify a subset of word line groups, of the plurality of word line groups, for a NAND detect empty page (NDEP) scan operation. The controller may perform, based on identifying the subset of word line groups, the NDEP scan operation for the subset of word line groups. A voltage threshold for the NDEP scan may be based on an offset voltage that can be adaptive based on parameters such as quantity of program-erase cycles, memory cell type, and/or operating temperature, among other examples.

24 Claims, 16 Drawing Sheets

1000

Beginning Of Life Look-Up Table

| Cell Type | Temp | Offset Voltage (DAC) |
|---|---|---|
| SLC | <0C | 51 |
| | 0C~30C | 55 |
| | >30C | 59 |
| MLC | <0C | 50 |
| | 0C~30C | 53 |
| | >30C | 56 |
| TLC | <0C | 17 |
| | 0C~30C | 24 |
| | >30C | 31 |

FIG. 11A

End Of Life Look-Up Table

| Cell Type | Temp | Offset Voltage (DAC) |
|---|---|---|
| SLC | <0C | 47 |
| | 0C~30C | 51 |
| | >30C | 55 |
| MLC | <0C | 46 |
| | 0C~30C | 49 |
| | >30C | 51 |
| TLC | <0C | 13 |
| | 0C~30C | 20 |
| | >30C | 27 |

FIG. 11B

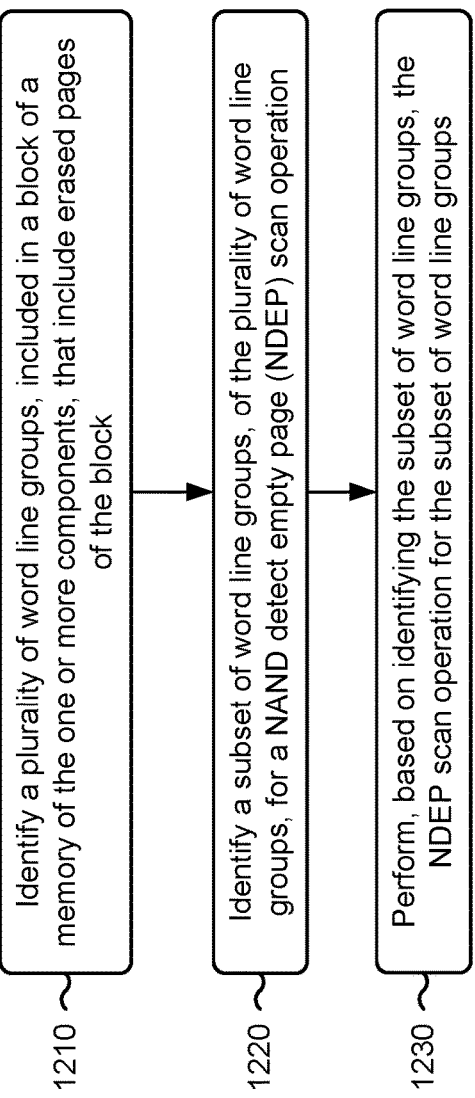

1210 Identify a plurality of word line groups, included in a block of a memory of the one or more components, that include erased pages of the block 1220 Identify a subset of word line groups, of the plurality of word line groups, for a NAND detect empty page (NDEP) scan operation 1230 Perform, based on identifying the subset of word line groups, the NDEP scan operation for the subset of word line groups

1310 — Identify a plurality of word line groups, included in a block of the memory, that include erased pages of the block 1320 — Determine that an erased threshold voltage distribution of subset of word line groups of the plurality of word line groups satisfies a threshold 1330 — Perform an empty page scan for the subset of word line groups

1300

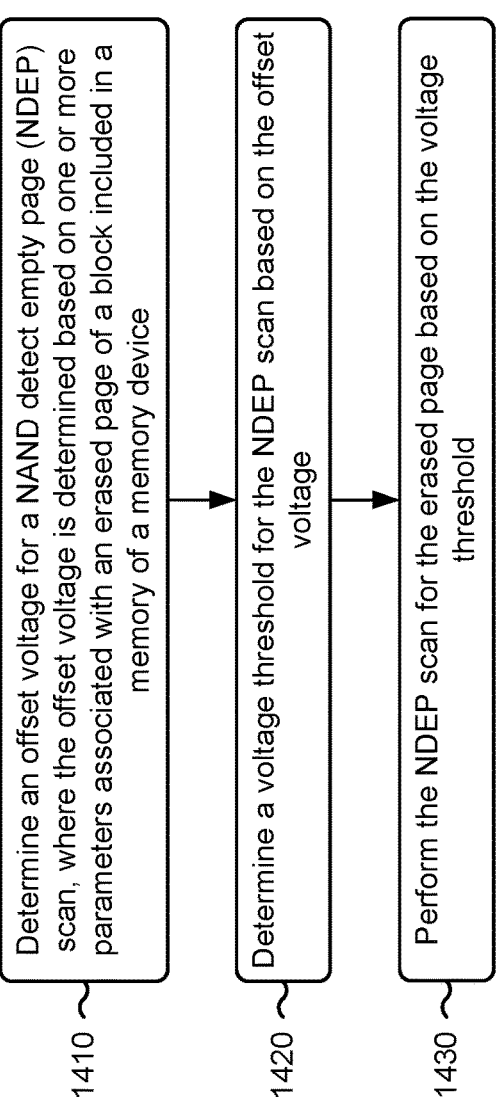

1410    Determine an offset voltage for a NAND detect empty page (NDEP) scan, where the offset voltage is determined based on one or more parameters associated with an erased page of a block included in a memory of a memory device 1420    Determine a voltage threshold for the NDEP scan based on the offset voltage 1430    Perform the NDEP scan for the erased page based on the voltage threshold

NAND DETECT EMPTY PAGE SCAN USING SUBSETS OF WORDLINES ON A PAGE

TECHNICAL FIELD

The present disclosure generally relates to memory devices, memory device operations, and, for example, to a NAND detect empty page scan operation.

BACKGROUND

A non-volatile memory device, such as a NAND memory device, can retain programmed and erased stored data even when a power source is not supplied. Non-volatile memory devices may be used in various types of electronic devices, such as computers, mobile phones, or automobile computing systems, among other examples.

A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "VPP," to a control gate to generate Fowler-Nordheim tunneling (referred to as "F-N tunneling") between a floating gate and a semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks" or "memory blocks"), by applying a high negative voltage, which may be referred to as an "erase voltage" or "Vera," to the control gate and a configured voltage to the bulk area to generate the F-N tunneling. In this case, electrons accumulated on the floating gate are discharged into the source area, so that the memory cells have an erased threshold voltage distribution.

Each memory cell string may have a plurality of floating gate type memory cells serially connected to each other. Word lines (sometimes called "access lines") are extended in a row direction, and a control gate of each memory cell is connected to a corresponding word line. A non-volatile memory device may include a plurality of page buffers connected between the bit lines and the column decoder. The column decoder is connected between the page buffer and data lines.

BRIEF DESCRIPTION OF THE DRAWINGS

FIGS. 11A and 11B are diagrams of examples of look-up tables that may be used to identify an offset voltage described herein.

FIG. 12 is a flowchart of an example method associated with an NDEP scan operation.

FIG. 14 is a flowchart of an example method associated with an NDEP scan operation.

DETAILED DESCRIPTION

Figure 1:
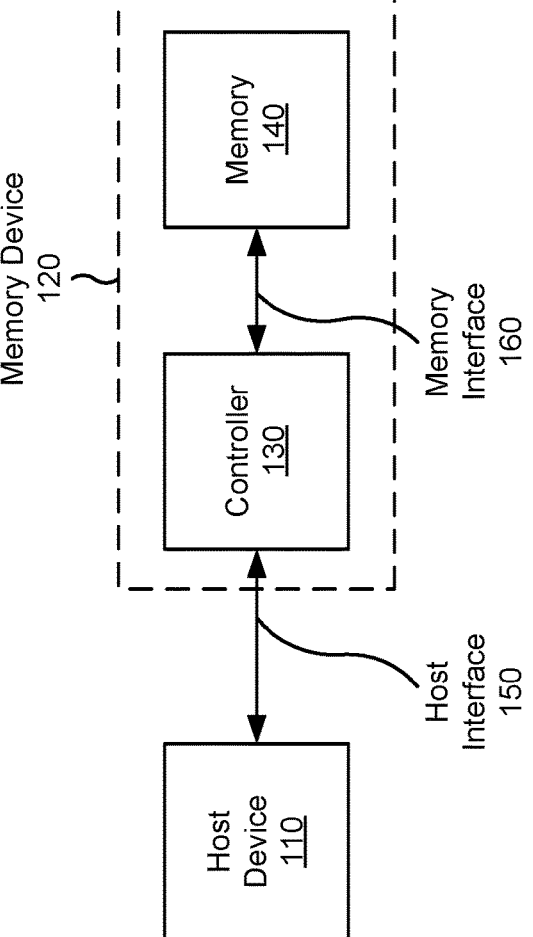
FIG. 1 is a diagram illustrating an example system configured to implement a NAND detect empty page (NDEP) scan based on an offset voltage.

In some cases, a threshold voltage ($V_t$) associated with a memory cell may shift or drift from an initial threshold voltage. This may occur, for example, in a partial block or in a fully erased block of the memory. "Partial block," as used herein, refers to a block of a memory that is physically open but logically closed. A partial block may include a subset of pages (or word lines that include pages) that are programmed and utilized, and another subset of pages that are erased and not utilized. A partial block and/or an erased block can experience threshold voltage shifting due to temperature, a physical arrangement of memory cells, age of the memory cells (e.g., based on a quantity of program-erase cycles (PECs)), and/or read disturbances, among other examples. In some cases, a shift in an erased threshold voltage may occur for an erased page in a block due to an increase in charge gain for the erased page. For example, charge gain for an erased page may cause a tail portion (e.g., an erased Vt distribution tail) of an erased threshold voltage distribution to increase and satisfy a threshold voltage. The threshold voltage shifting may result in an increased likelihood of read errors (or read disturbances) in the memory device, an increased rate of read errors in the memory device, an increased trigger rate for the memory device, and/or an increased folding rate for the memory device, among other examples.

In some implementations described herein, a controller of a memory device may perform a NAND detect empty page (NDEP) scan to determine whether an erased page in a block (e.g., a partial block or an erased block) that is stored in a memory of the memory device is still valid for programming. The NDEP scan may include scanning the erased pages of the block to determine whether a tail portion of an erase threshold voltage distribution for the erased pages satisfies a voltage threshold. The voltage threshold is based on an offset voltage applied to a read voltage for the erased pages of the block. If the erase threshold voltage distribution for an erased page satisfies the voltage threshold, one or more remedial actions may be performed, such as a block refresh for the block and/or a folding operation in which data in the block is moved to different memory cells, among other examples.

As further described herein, the NDEP scan may be performed for a subset of the erased pages included in the block to reduce the duration and/or to increase the accuracy of the NDEP scan. In particular, the NDEP scan may be performed for a subset of erased pages that is associated with word line groups (WLGs) that are expected to experience the greatest amount of E0 charge gain (and thus, the greatest amount of erase threshold voltage shifting). Moreover, the voltage threshold for the NDEP scan may be based on parameters that may affect, such as the physical location of the memory cells of the erased pages in the memory, the operating temperature of the memory, and/or the age of the memory cells of the erased pages in the memory (e.g., as determined by the quantity of PECs for the memory cells), among other examples. This may reduce the likelihood of page refreshes and/or folding operations for erased pages in a block of the memory at higher temperatures, may reduce the likelihood of page refreshes and/or folding operations for erased pages in a block of the memory as the memory ages, and/or may reduce the likelihood of a latent read disturb in the memory, among other examples.

FIG. 1 is a diagram illustrating an example system 100 configured to implement an NDEP scan based on an offset voltage. The system 100 may include one or more devices, apparatuses, and/or components for performing operations described herein (e.g., for memory device wear leveling). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

In some implementations, the host device 110 may be or may be included in a vehicle, and may be configured to display (or generate for display) an infotainment system of the vehicle, a digital dashboard of the vehicle, and/or a navigation system of the vehicle, among other examples. In some implementations, the host device 110 may be configured to provide smart or autonomous driving functionality for the vehicle, sensing functionality for the vehicle, and/or another functionality for the vehicle.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

In some implementations, the memory device 120 may be configured to store host data for the host device 110. The host data may include, for example, a file system and associated data for a digital dashboard of the vehicle, a file system and associated data for an infotainment system of the vehicle, a mapping database for a navigation system of the vehicle, and/or a point of interest (POI) database for the navigation system of the vehicle, among other examples. Moreover, the memory device 120 may be configured to provide user-accessible storage for user data, which may include storage for user files, audio and/or video recordings, and/or user contact data, among other examples.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

In some implementations, the memory 140 may include non-volatile memory configured to maintain stored data after the memory device 120 is powered off. For example, the memory 140 may include NAND memory or NOR memory. Additionally, or alternatively, the memory 140 may include volatile memory that requires power to maintain stored data and that loses stored data after the memory device 120 is powered off. For example, the memory 140 may include one or more latches and/or random-access memory (RAM), such as dynamic RAM (DRAM) and/or static RAM (SRAM).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more components of the memory device 120 (e.g., the controller 130, the memory 140) are configured to identify a plurality of word line groups, included in a block of the memory 140, that include erased pages of the block; identify a subset of word line groups, of the plurality of word line groups, for an NDEP scan operation; and/or perform, based on identifying the subset of word line groups, the NDEP scan operation for the subset of word line groups. In some implementations, one or more components of the memory device 120 (e.g., the controller 130, the memory 140) are configured to identify a plurality of word line groups, included in a block of the memory 140, that include erased pages of the block; determine that an erased threshold voltage distribution of a subset of word line groups of the plurality of word line groups satisfies a threshold; and/or perform an empty page scan for the subset of word line groups. In some implementations, one or more components of the memory device 120 (e.g., the controller 130, the memory 140) are configured to determine an offset voltage for an NDEP scan, the offset voltage being determined based on one or more parameters associated with an erased page of a block included in the memory 140; determine a voltage threshold for the NDEP scan based on the offset voltage; and/or perform the NDEP scan for the erased page based on the voltage threshold. In some implementations, one or more components of the memory device 120 (e.g., the controller 130, the memory 140) are configured to perform one or more other operations described herein, such as one or more operations described in connection with FIGS. 7-14.

As indicated above, FIG. 1 is provided as an example. Other examples may differ from what is described with regard to FIG. 1.

Figure 2:
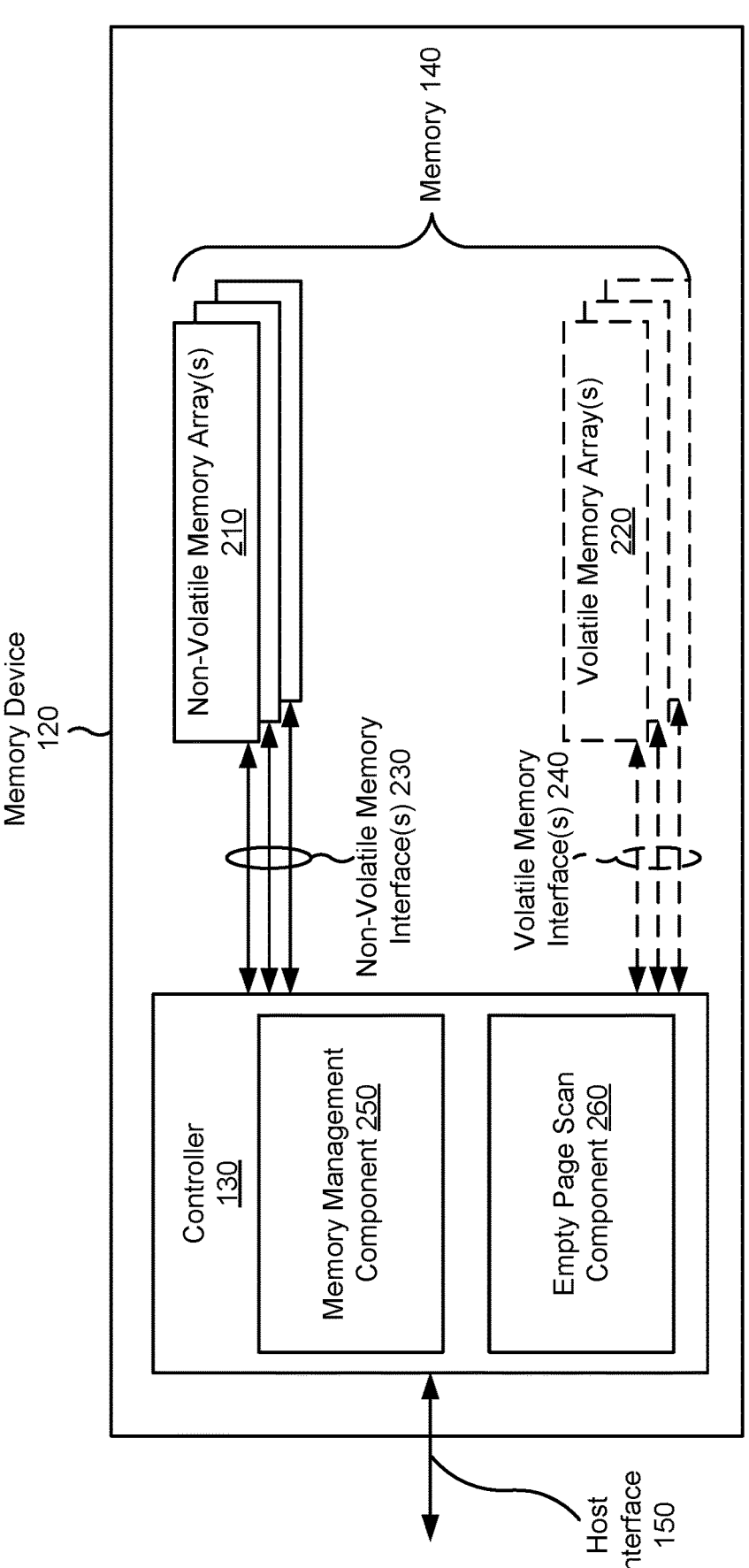
FIG. 2 is a diagram of example components included in the memory device of FIG. 1.

FIG. 2 is a diagram of example components included in the memory device 120 of FIG. 1. As described above in connection with FIG. 1, the memory device 120 may include a controller 130 and memory 140. As shown in FIG. 2, the memory 140 may include one or more non-volatile memory arrays 210. The non-volatile memory array(s) 210 may each include a plurality of physical memory cells and may be included in one or more memory arrays, such as one or more NAND memory arrays and/or one or more NOR memory arrays. The non-volatile memory array(s) 210 may include flash memory cells, EEPROM cells, and/or another type of non-volatile memory cells. Additionally, or alternatively, the memory 140 may include one or more volatile memory arrays 220, which may include one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The volatile memory array(s) 220 may be used for functions such as caching or buffering of data that is to be written to the non-volatile memory array(s) 210, caching or buffering of data read from the non-volatile memory array(s) 210 (e.g., prior to providing the data to the host device 110), for storing and/or maintaining one or more mapping tables (e.g., logical to physical (L2P) mapping tables and/or another type of mapping tables) associated with the non-volatile memory array(s) 210, storing parity information associated with the non-volatile memory array(s) 210, and/or storing error correction code (ECC) information associated with the non-volatile memory array(s) 210, among other examples.

Alternatively, the volatile memory array(s) 220 may be omitted from the memory device 120. A memory device 120 without volatile memory array(s) 220 may be referred to as a DRAM-less memory device or a RAM-less memory device. In these types of memory devices 120, the controller 130 may use a portion of the non-volatile memory array(s) 210 for caching, buffering, and/or temporary storage. Additionally and/or alternatively, the host device 110 may allocate a portion of the volatile memory of the host device 110, which may be referred to as a host memory buffer (HMB), and the host device 110 may provide the memory device 120 with direct memory access (DMA) to the portion of the volatile memory of the host device 110 via the host interface 150. The controller 130 may access the portion of the volatile memory of the host device 110 (e.g., the HMB) and may use the portion of the volatile memory of the host device 110 for caching, buffering, and/or temporary storage, among other examples.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hard-wired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250. In some implementations, the controller 130 also includes an empty page scan component 260 and/or another component. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The empty page scan component 260 may be configured to perform an empty page scan operation such as an NDEP scan operation to determine whether an erased page in a block (e.g., a partial block, an erased block) of the memory 140 is still valid for programming. The block may be included in a non-volatile memory array 210, a volatile memory array 220, and/or in another memory array of the memory 140. Moreover, the empty page scan component 260 may store, determine, and/or apply one or more read offset voltages that are to be used by the controller 130 for an empty page scan operation. The one or more read offset voltages may be used to account for erase threshold voltage shifts in the word line groups of the block, which may occur due to temperature, age and usage of the memory 140, the physical location of the memory cells associated with the word line groups in the memory 140, and/or the memory cell types associated with the memory cells, among other examples.

One or more devices or components shown in FIG. 2 may be used to carry out operations described elsewhere herein, such as one or more operations of FIGS. 8-12 and/or one or more process blocks of the methods of FIGS. 13-17. For example, the controller 130 and/or the memory management component 250 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
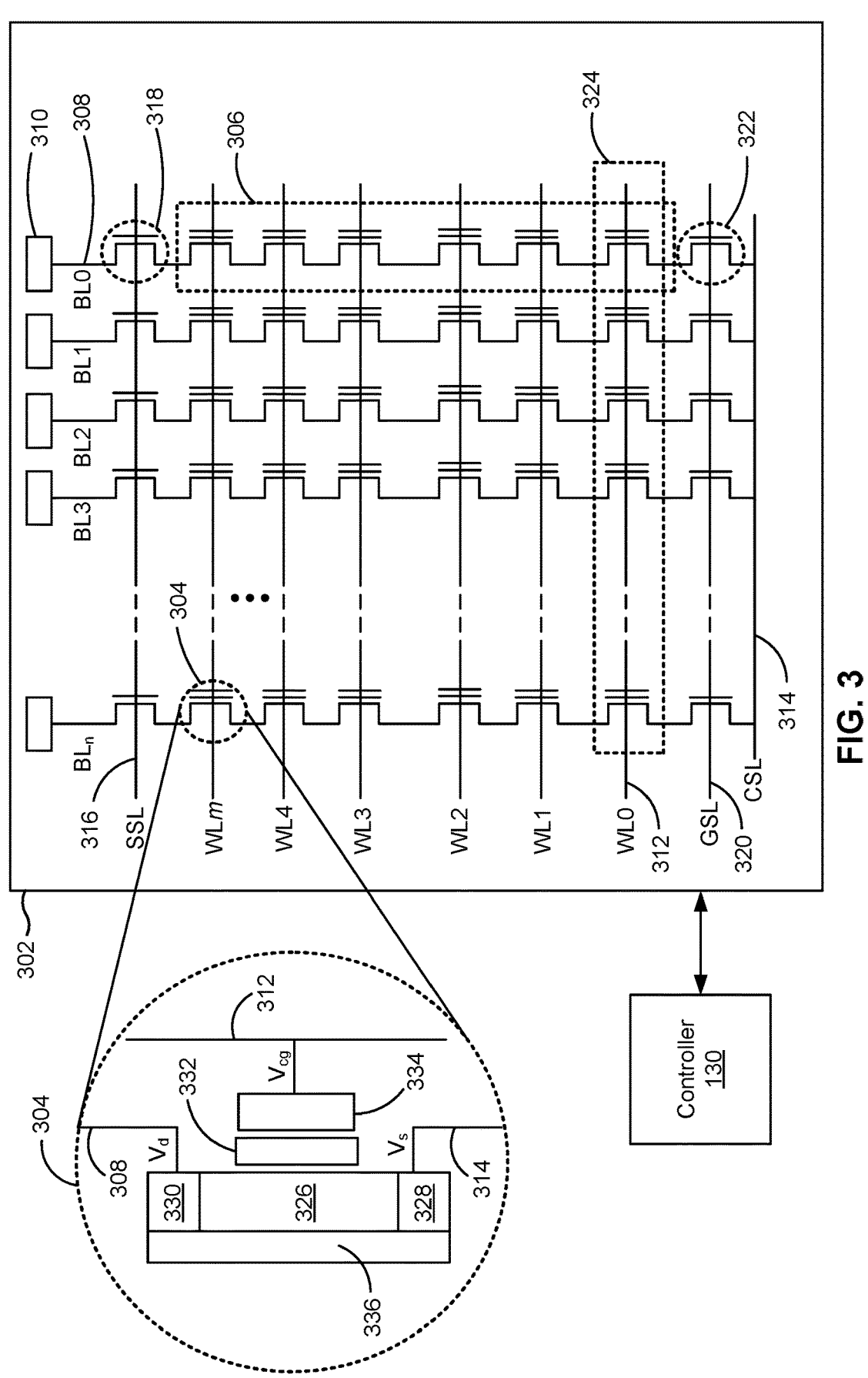
FIG. 3 is a diagram of example components included in a memory device.

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 210 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn). Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via word lines 312 (sometimes called access lines or row lines, and shown as WL0-WLm) that select which row (or rows) of memory cells 304 is affected by a memory operations (e.g., a read operation or a write operation, sometimes called a program operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same word line 312, as shown by reference number 324. In some implementations (e.g., for single-level cells), the memory cells 304 connected to a word line 312 may be associated with a single page of memory. In some implementations (e.g., for multi-level cells), the memory cells 304 connected to a word line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding word line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage $V_d$ may be supplied from a bit line 308, a control gate voltage $V_{cg}$ may be supplied from a word line 312, and a source voltage $V_s$ may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding word line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used.

To read the memory cell 304, a read voltage may be applied to the control gate 334 (e.g., via a corresponding word line 312), and an I/O component 310 (e.g., a sense amplifier) may determine the data state of the memory cell 304 based on whether or not current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each word line 312 other than the word line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level memory cell that stores one of two data states, the data state is a "1" if current is detected, and the data state is a "0" if current is not detected. In a multi-level memory cell that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding word line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1").

As indicated above, FIG. 3 is provided as an example. Other examples may differ from what is described with regard to FIG. 3.

Figure 4:
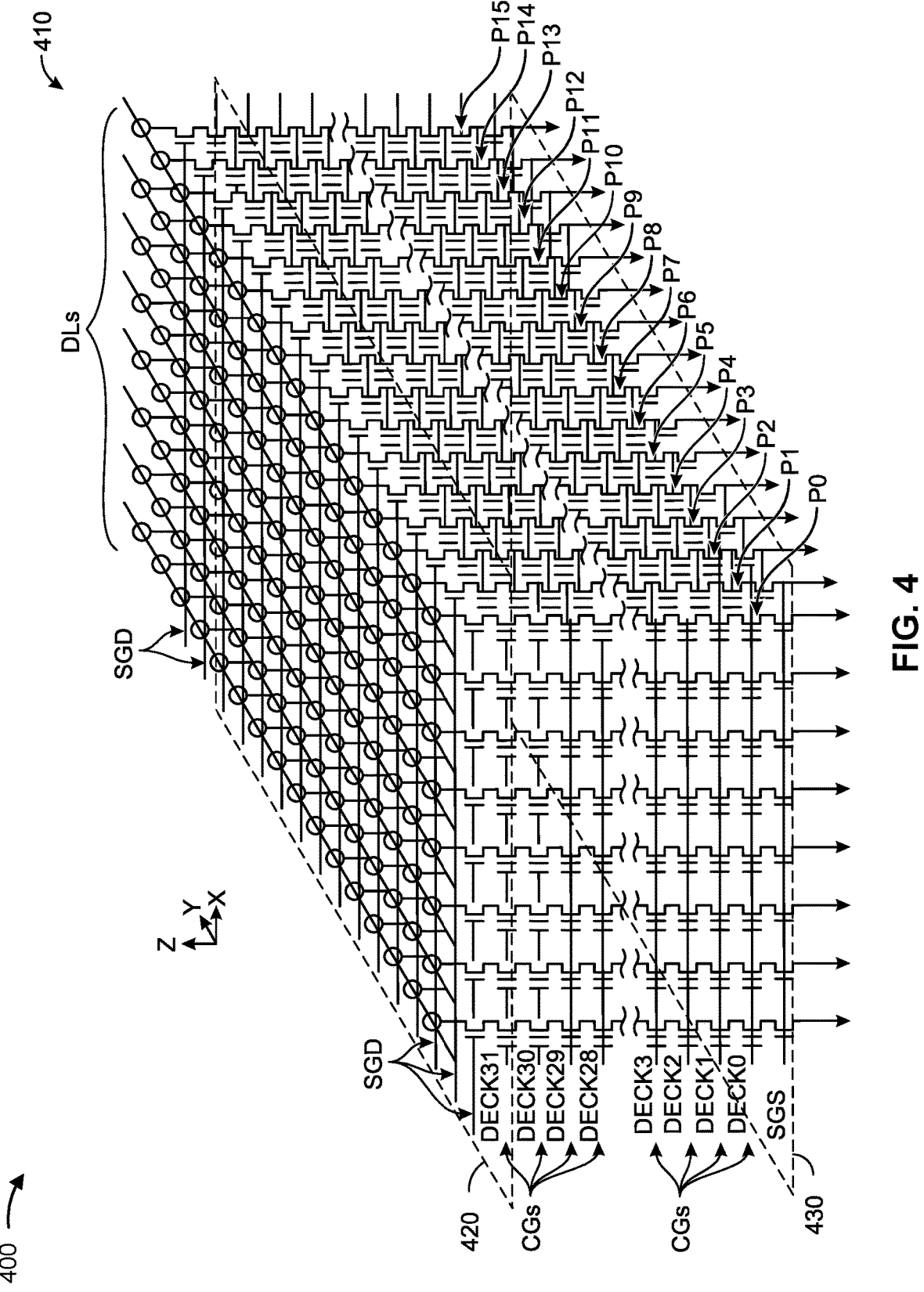
FIG. 4 is a diagram illustrating an example of a memory array.

FIG. 4 is a diagram illustrating an example 400 of a memory array 410. The memory array 410 may include a 3D NAND memory array in which a plurality of 2D horizontal tiers or decks of memory cells are stacked in a 3D manner.

The memory array 410 includes multiple strings of memory cells, and each string including 32 decks or tiers (shown as DECK0-DECK31) of charge storage transistors stacked in the Z direction, source to drain, from a source-side select gate (SGS) to a drain-side select gate (SGD). Each deck in the memory array 410 may correspond to a memory array 302 of memory cells 304. Each deck may include and/or may be associated with one or more word line groups (WLGs).

Each string of memory cells in the memory array 410 may be arranged along the Y direction as data lines (shown as DLs), and along the X direction as pages (shown as P0-P15).

Within a page, each deck represents a row of memory cells, and each string of memory cells represents a column. A block of memory cells may include a number of pages (e.g., 128 or 384). In other examples, each string of memory cells may include a different number of decks (e.g., 8, 16, 64, or 128), and/or one or more additional decks of semiconductor material above or below the charge storage transistors (e.g., to form select gates or data lines).

Each memory cell in the memory array 410 includes a control gate coupled to (e.g., electrically or otherwise operatively connected to) a word line, which collectively couples the control gates across a specific deck or a portion of a deck. Specific decks in the 3D memory array, and accordingly, specific memory cells in a string, may be accessed or controlled using respective access lines. For example, the memory array 410 includes a first level of semiconductor material 420 (e.g., silicon material, such as polysilicon) that couples the control gates of each memory cell in DECK31, and a second level of semiconductor material 430 that couples the SGS of the array. Similar levels of metal or semiconductor material may couple the control gates for each deck. Specific strings of memory cells in the array may be accessed, selected, or controlled using a combination of data lines (DLs) and select gates, and specific memory cells at one or more decks in the specific strings may be accessed, selected, or controlled using one or more access lines. In some implementations, the memory device 120 may include the memory array 410 of FIG. 4. For example, the memory 140 may be the memory array 410.

Each of the DECK0-DECK31 may include one or more word line groups (WLGs), which are groups of a plurality of word lines that may or may not be adjacent word lines. For example, a word line group may include word lines WL0-WLm, or a subset thereof. DECK0-DECK31 may be stacked or vertically arranged in the memory 140 such that the DECK0 is the lowest (or bottom-most) deck in the physical structure of the memory 140, and the DECK31 is the highest deck in the physical structure of the memory 140. In some cases, the electric field strength for DECK0-DECK31 may increase as a function of depth in the memory 140. The electric field strength for the DECK31 may be the lowest electric field strength among DECK0-DECK31, and the electric field strength for the DECK0 may be the highest electric field strength among DECK0-DECK31. Electric field strength may be correlated with erased threshold voltage magnitude and distribution. The memory cells and associated word lines in the DECK0 may have the highest erase threshold voltage magnitude and largest distribution due to the higher electric field strength in the DECK0, whereas memory cells and associated word lines in the DECK31 may have the lowest erase threshold voltage magnitude and smallest distribution due to the lower electric field strength in the DECK31.

As indicated above, FIG. 4 is provided as an example. Other examples may differ from what is described with regard to FIG. 4.

Figure 5:
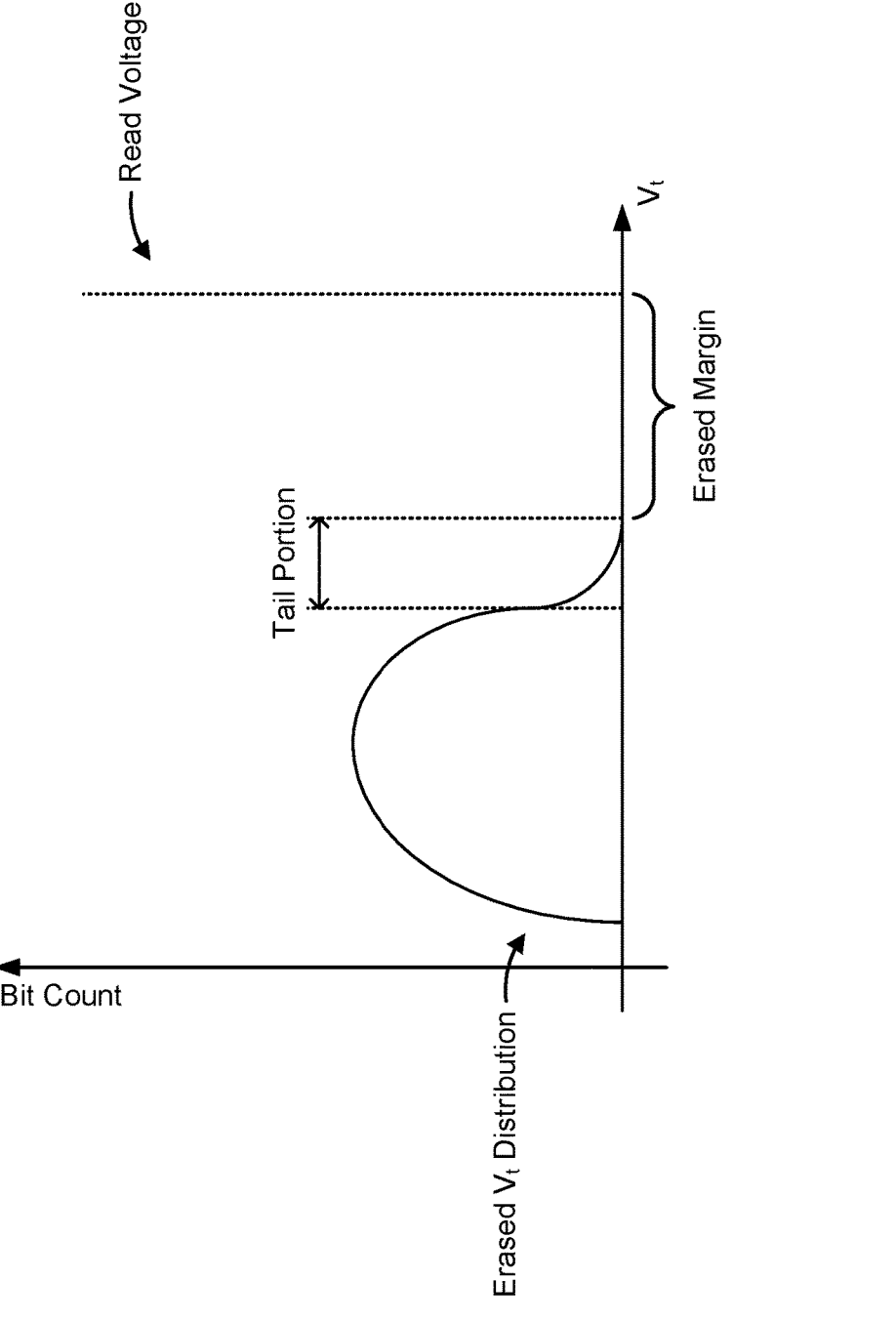
FIG. 5 is a diagram of an example of an erased threshold voltage distribution described herein.

FIG. 5 is a diagram of an example 500 of an erased threshold voltage distribution described herein. The erased threshold voltage distribution may be a function of bit count and erased threshold voltage (V) for a word line group of a block stored in the memory 140 described herein.

As shown in FIG. 5, an erased threshold voltage distribution may include a main portion and a tail portion. In some implementations, depending on the memory cell location of the memory cells included in the word line group, the operating temperature of the memory 140, the quantity of PECs accumulated for the memory cell, and/or the memory cell type of the memory cell, the erased threshold voltage distribution may include only the main portion and not a tail portion.

The erased threshold voltage distribution for the word line group may be an indicator of a quantity of bits (e.g., a bit count) that are determined as a non-erased value (e.g., a 0-value or a 1-value). Thus, a higher magnitude of the erase threshold voltage and/or a longer distribution of the erase threshold voltage may indicate a greater quantity of bit errors and, therefore, a higher bit error rate for the word line group. Thus, depending on the erased threshold voltage distribution (particularly the length and magnitude of the tail portion), the bit error rate may be too high for the word line group for subsequent programming. The voltage difference between the end of the tail portion of the erased threshold voltage distribution and the read voltage for the word line group (e.g., for the memory cells of the word line group) may be referred to as the threshold voltage (Vt) margin.

The length and magnitude of the tail portion may increase as the memory cell ages (e.g., as the quantity of PECs accumulated for the memory cell increases), and/or as the memory cell experiences charge gain, among other examples. Moreover, the length and magnitude of the tail portion may be larger for memory cells located in the lowest or bottom-most deck(s) of the memory 140 (e.g., DECK0) and/or for memory cells that have a greater quantity of levels (e.g., triple-level cells (TLCs), quad-level cells (QLCs)) relative to those with a lesser quantity of levels (e.g., single-level cells (SLCs)), among other examples.

As indicated above, FIG. 5 is provided as an example. Other examples may differ from what is described with regard to FIG. 5.

Figure 6:
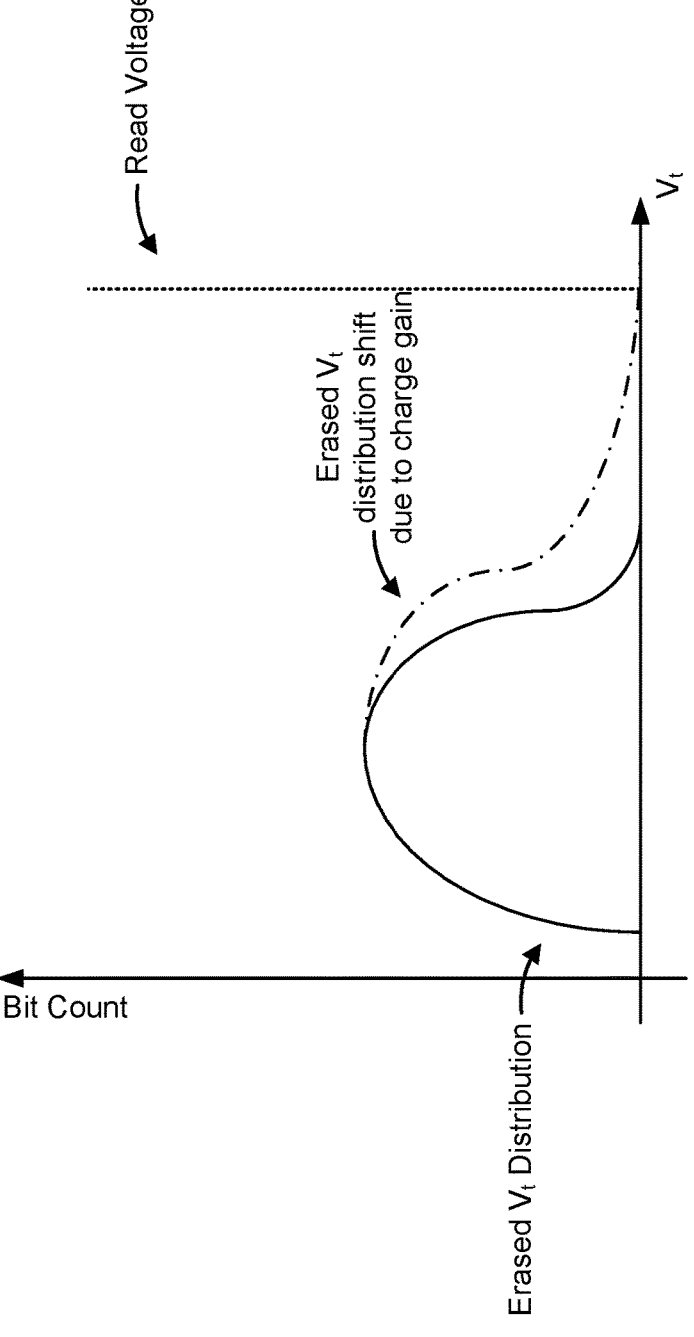
FIG. 6 is a diagram of an example of a charge gain in an erased voltage distribution of a word line group described herein.

FIG. 6 is a diagram of an example 600 of a charge gain in a word line group described herein. As shown in FIG. 6, a charge gain may result in a shift (e.g., an extension) of the erased threshold voltage ($V_t$) distribution for a word line group. The extension may occur in the main portion and/or in the tail portion of the erase threshold voltage distribution. The charge gain may reduce the voltage margin and may result in a read disturbance for the word line group, among other examples.

As indicated above, FIG. 6 is provided as an example. Other examples may differ from what is described with regard to FIG. 6.

Figure 7:
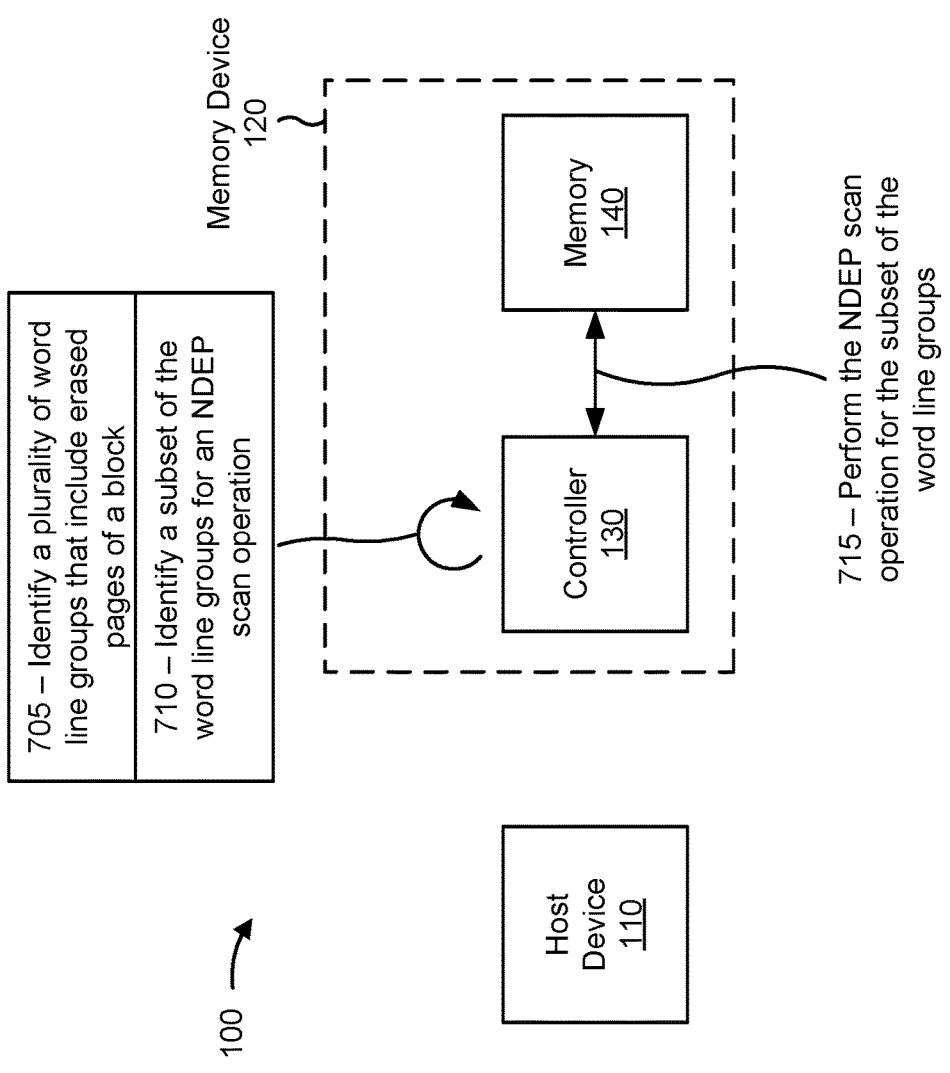
FIG. 7 is a diagram of an example of an NDEP scan operation described herein.

FIG. 7 is a diagram of an example 700 of an NDEP scan operation described herein. The NDEP scan operation may be performed by the controller 130 to determine whether an erased page in a block (e.g., a partial block, an erased block) stored in the memory 140 is still valid for programing. In this way, the NDEP scan operation may be performed to detect charge gains in the word line group associated with the erased page.

At 705, the controller 130 (and/or the empty page scan component 260 of the controller 130) may identify a plurality of word line groups that include erased pages of a block stored in the memory 140. As indicated above, the block may be a partial block, an erased block, and/or another type of block that includes erased pages. In some implementations, the controller 130 may determine the block type associated with the block based on a last written page (LWP) associated with the block. For example, the controller 130 may identify the LWP of the block, and may determine whether the LWP satisfies a threshold page of the block. The threshold page may correspond to the maximum page of the block. Accordingly, the controller 130 may determine whether the LWP is less than the maximum page of the block, and may determine the block type associated with the block based on whether the LWP is less than the maximum page of the block. For example, the controller 130 may determine that the block is a partial block type based on determining that the LWP of the block is less than the maximum page of the block.

Moreover, the controller 130 may identify the word line groups that include erased pages based on the LWP of the block. For example, the controller 130 may determine that all pages greater than the LWP of the block are erased pages. The controller 130 may identify the word line groups associated with the pages greater than the LWP of the block.

At 710, the controller 130 (and/or the empty page scan component 260 of the controller 130) may identify a subset of the word line groups for an NDEP scan operation for the block. In particular, the NDEP scan operation may be performed for a subset of erased pages that are associated with word line groups of the block that are expected to experience the greatest amount of charge gain and, thus, the greatest amount of erase threshold voltage shifting.

In some implementations, the word line groups in the subset of word line groups may be preselected and/or preconfigured for the controller 130, and the controller 130 identifies the subset of word line groups based on an indication of the subset of word line groups stored in a memory (e.g., in a local memory of the controller 130, in the memory 140, and/or in another memory). The subset of word line groups may be selected based on testing and/or characterization of the memory cells of the word line groups in the memory 140.

For example, testing may be performed to determine the charge gains and erased threshold voltage shifting for the memory cells of the word line groups of the memory 140 that are expected and/or estimated to occur during operation of the memory device 120. The subset of word line groups may be selected from the word line groups that experience the worst charge gains and erased threshold voltage shifting during the testing, and therefore have the lowest erased threshold voltage distribution margin of the plurality of word line groups. Selecting particular word line groups may reduce the likelihood of latent read disturbs in the memory device 120 and/or may improve the quality of service (QoS) provided by the memory device 120.

As another example, the word line groups that are physically located in the bottom-most deck (e.g., DECK0) or bottom-most decks (e.g., DECK0-DECK3) may be selected for the subset of word line groups, as these word line groups may be more likely to experience greater charge gains and erased threshold voltage shifting relative to other word line groups in higher decks.

In some implementations, the controller 130 may identify the subset of word line groups in a dynamic manner. In these implementations, the word line groups in the subset of word line groups are not preselected or preconfigured, and the controller 130 identifies the word line groups for the subset of word line groups based on one or more parameters associated with the memory 140. In this way, the word line groups in the subset of word line groups may change depending on the parameters associated with the memory 140.

The parameters may include an estimated threshold voltage margin for the memory cells of the word line groups, the ages of the memory cells (e.g., the quantity of PECs accumulated for the memory cells), the memory cell types of the memory cells, and/or the physical locations of the memory cells. For example, the controller 130 may identify word line groups for the subset of word line groups that have the greatest quantity of accumulated PECs. As another example, the controller 130 may identify the word line groups for the subset of word line groups that include TLC memory cells and/or QLC memory cells.

In some implementations, the controller 130 performs a pre-scan (e.g., prior to performing an NDEP scan) of the memory cells of the plurality of word line groups to determine the erase threshold voltage distributions for the plurality of word line groups. The controller 130 may determine that the erase threshold voltage distribution for a subset of word line groups of the plurality of word line groups satisfies a threshold and may perform the NDEP scan operation based on the determination. The threshold may be based on one or more of the parameters associated with the memory 140 described above.

At 715, the controller 130 (and/or the empty page scan component 260 of the controller 130) may perform the NDEP scan operation for the subset of the word line groups. The NDEP scan operation may include scanning the erased pages associated with the subset of word line groups to determine whether an erased threshold voltage distribution for the erased pages satisfies a voltage threshold. The voltage threshold may be based on an offset voltage applied to a read voltage for the erased pages of the block. If the controller 130 determines that the erase threshold voltage distribution for an erased page satisfies the voltage threshold (which may be an indicator of a high bit error rate), one or more remedial actions may be performed, such as a block refresh for the block and/or a folding operation, among other examples. A block refresh may include re-programming the programmed pages and re-erasing the erased pages to reset the voltages for the pages in the block. A folding operation may include moving the data stored in the programmed pages of the block to different memory cells.

As indicated above, FIG. 7 is provided as an example. Other examples may differ from what is described with regard to FIG. 7.

Figure 8:
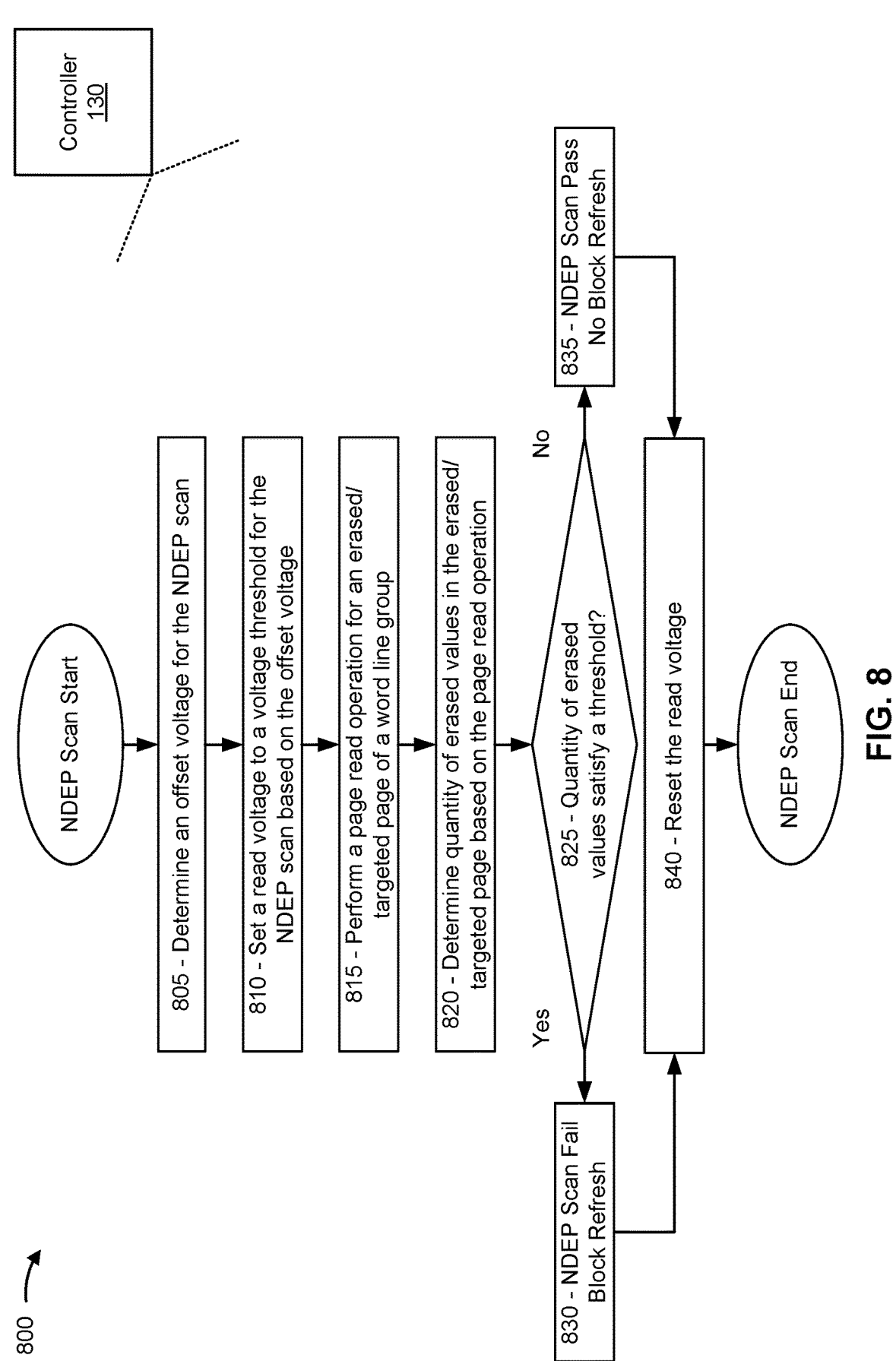
FIG. 8 is a diagram of an example of an NDEP scan described herein.

FIG. 8 is a diagram of an example 800 of an NDEP scan described herein. The NDEP scan operation may be performed by the controller 130 to determine whether erased pages in a word line group of a block (e.g., a partial block, an erased block) stored in the memory 140 are still valid for programing. In this way, the NDEP scan operation may be performed to detect charge gains in the word line group associated with the erased pages. In some implementations, the NDEP scan operation may be performed for a subset of word line groups, of the block, that include erased pages. The controller 130 may identify the subset of word line groups using one or more techniques described herein, such as in connection with FIG. 7, among other examples.

At 805, the controller 130 (and/or the empty page scan component 260 of the controller 130) may determine an offset voltage for the NDEP scan operation of the word line group. The offset voltage may be used to determine a voltage threshold for the NDEP scan operation. The offset voltage may be dynamically determined and may be different for different parameters and/or operating conditions of the memory 140. This enables the voltage threshold to be dynamically determined (and optimized) for the one or more parameters and/or operating conditions of the memory 140, such as operating temperature, memory cell type, and/or PEC quantity, among other examples.

As an example, the controller 130 may determine the offset voltage based on an operating temperature of memory cells associated with the erased pages (e.g., the operating temperature of the erased pages) of the word line group. In general, the magnitude of the offset voltage may increase as the operating temperature of the erased page increases, and may decrease as the operating temperature of the erased page increases. This enables the voltage threshold to be higher for lesser operating temperatures due to the lesser erased margin at lesser operating temperatures, and enables the voltage threshold to be lower for greater operating temperatures due to a greater erase margin at greater operating temperatures. The relaxed voltage threshold for the NDEP scan at lower operating temperatures may help to reduce the likelihood of unnecessary folding operations for the erased pages of the word line group.

As another example, the controller 130 may determine the offset voltage based on a quantity of PECs accumulated for the memory cells associated with the erased pages of the word line group. In general, the magnitude of the offset voltage may increase as the quantity of PECs accumulated for the memory cells increases. This enables the voltage threshold for the NDEP scan to be higher when the memory cells are near the beginning of life (BOL) of the memory cells due to the greater erased margin at the BOL of the memory cells, and enables the voltage threshold to be lower when the memory cells are near the end of life (EOL) of the memory cells due to the lesser erased margin at or near the EOL of the memory cells. The relaxed voltage threshold for the NDEP scan as the memory cells approach EOL may help to reduce the likelihood of unnecessary folding operations for the erased pages of the word line group without compromising the reliability of the memory device.

As another example, the controller 130 may determine the offset voltage based on a memory cell type for the memory cells associated with the erased pages of the word line group. In general, the magnitude of the offset voltage may decrease as the quantity of levels of the memory cells increases. For example, the magnitude of the offset voltage may be greatest for SLC memory cells. The magnitude of the offset voltage may be lesser for multi-level cell (MLC) memory cells relative to the magnitude of the offset voltage for SLC memory cells (e.g., for the same operating temperature and PEC quantity). The magnitude of the offset voltage may be lesser for TLC memory cells relative to the magnitude of the offset voltage for MLC memory cells (e.g., for the same operating temperature and PEC quantity). The magnitude of the offset voltage may be lesser for QLC memory cells relative to the magnitude of the offset voltage for TLC memory cells (e.g., for the same operating temperature and PEC quantity).

As another example, the controller 130 may determine the offset voltage based on a location, in the memory 140, of the memory cells associated with the erased pages of the word line group. In general, the magnitude of the offset voltage may decrease the lower the deck in which the memory cells are included. For example, the magnitude of the offset voltage may be lower for a word line group in which the memory cells are located at the bottom-most deck, and the magnitude of the offset voltage may be higher for word line groups in which memory cells are located in higher decks.

In some implementations, the controller 130 determines the offset voltage by identifying the offset voltage in a look-up table stored in a memory (e.g., in a memory of the controller 130, in the memory 140, in another memory). For example, the controller 130 may identify the offset voltage in the look-up table based on one or more parameters associated with the memory cells associated with the erased pages of the word line group. As an example, the controller 130 may identify the offset voltage in a row of the look-up table corresponding to the memory cell type and the operating temperature of the memory cells associated with the erased pages of the word line group. In some implementations, a plurality of look-up tables are stored in the memory, and the controller 130 identifies the look-up table that is to be used to identify the offset voltage from the plurality of look-up tables. As an example, the controller 130 may determine that the memory cells are at or near BOL, and may identify a BOL look-up table that is to be used to identify the offset voltage from the plurality of look-up tables. As an example, the controller 130 may determine that the memory cells are at or near EOL, and may identify an EOL look-up table that is to be used to identify the offset voltage from the plurality of look-up tables. Examples of look-up tables that may be used are described in connection with FIGS. 11A and 11B. However, other examples of look-up tables are within the scope of the present disclosure.

At 810, the controller 130 (and/or the empty page scan component 260 of the controller 130) may set a read voltage for the erased pages of the word line group to a voltage threshold for the NDEP scan based on the offset voltage. Accordingly, the voltage threshold may be based on the one or more parameters associated with the word line group. The controller 130 may set the read voltage for the erased pages of the word line group to the voltage threshold for the NDEP scan by applying the offset voltage to the read voltage. This results in a shift of the read voltage. The voltage threshold may be set to a lesser voltage relative to the read voltage based on the offset voltage. The controller 130 may use one or more commands to set the read voltage for the erased pages of the word line group to the voltage threshold for the NDEP scan, such as an EAh command or an EBh command, among other examples.

At 815, the controller 130 (and/or the empty page scan component 260 of the controller 130) may perform a page read operation for an erased/targeted page of the word line group. The controller 130 may perform the page read operation for each erased/targeted page of the word line group to determine an erased threshold voltage distribution for each erased/targeted page.

At 820, the controller 130 (and/or the empty page scan component 260 of the controller 130) may determine the quantity of erased values for the memory cells of the erased/targeted pages of the subset of word line groups. In some implementations, the controller 130 may determine the quantity of erased values based on determining whether the erased threshold voltage distribution for the erased page satisfies a voltage threshold (which may be an indicator of a high bit error rate).

At 825, the controller 130 (and/or the empty page scan component 260 of the controller 130) may determine whether the quantity of erased values satisfies a threshold (e.g., a threshold quantity of non-erased values). The threshold may correspond to the voltage threshold. The quantity of erased values for a word line group may correspond to (or may be based on) the erased threshold voltage distribution for the word line group. The controller 130 may determine the voltage threshold distribution for the word line group at 820 based on the page read operation performed at 815. The controller 130 may determine whether a tail portion (or a main portion) of the erased threshold voltage distribution satisfies or crosses the voltage threshold. Here, the controller 130 may determine whether the erased threshold voltage of the tail portion of the erased threshold voltage distribution for the word line group satisfies the voltage threshold, and may determine whether the NDEP scan operation passed or failed based on whether the erased threshold voltage of the tail portion of the erased threshold voltage distribution for the word line group satisfies the voltage threshold.

At 830, if the controller 130 (and/or the empty page scan component 260 of the controller 130) determines that the quantity of erased values (e.g., 0-values, 1-values) satisfies the threshold (825-Yes), the controller 130 (and/or the empty page scan component 260 of the controller 130) may determine that the NDEP scan operation failed. In this case, the controller 130 (and/or the empty page scan component 260 of the controller 130) may perform one or more remedial actions for the block, such as a block refresh for the block and/or a folding operation, among other examples. A block refresh may include re-programming the programmed pages and re-erasing the erased pages to reset the voltages for the pages in the block. A folding operation may include moving the data stored in the programmed pages of the block to different memory cells.

At 835, if the controller 130 (and/or the empty page scan component 260 of the controller 130) determines that the quantity of-erased values does not satisfy the threshold, the controller 130 (and/or the empty page scan component 260 of the controller 130) may determine that the NDEP scan operation passed. In this case, the controller 130 (and/or the empty page scan component 260 of the controller 130) may refrain from performing one or more remedial actions for the block (e.g., no block refresh and no folding operation).

At 840, the controller 130 (and/or the empty page scan component 260 of the controller 130) may reset the read voltage to the original/baseline read voltage for the memory cells of the erased pages in the word line group.

As indicated above, FIG. 8 is provided as an example. Other examples may differ from what is described with regard to FIG. 8.

Figure 9A:
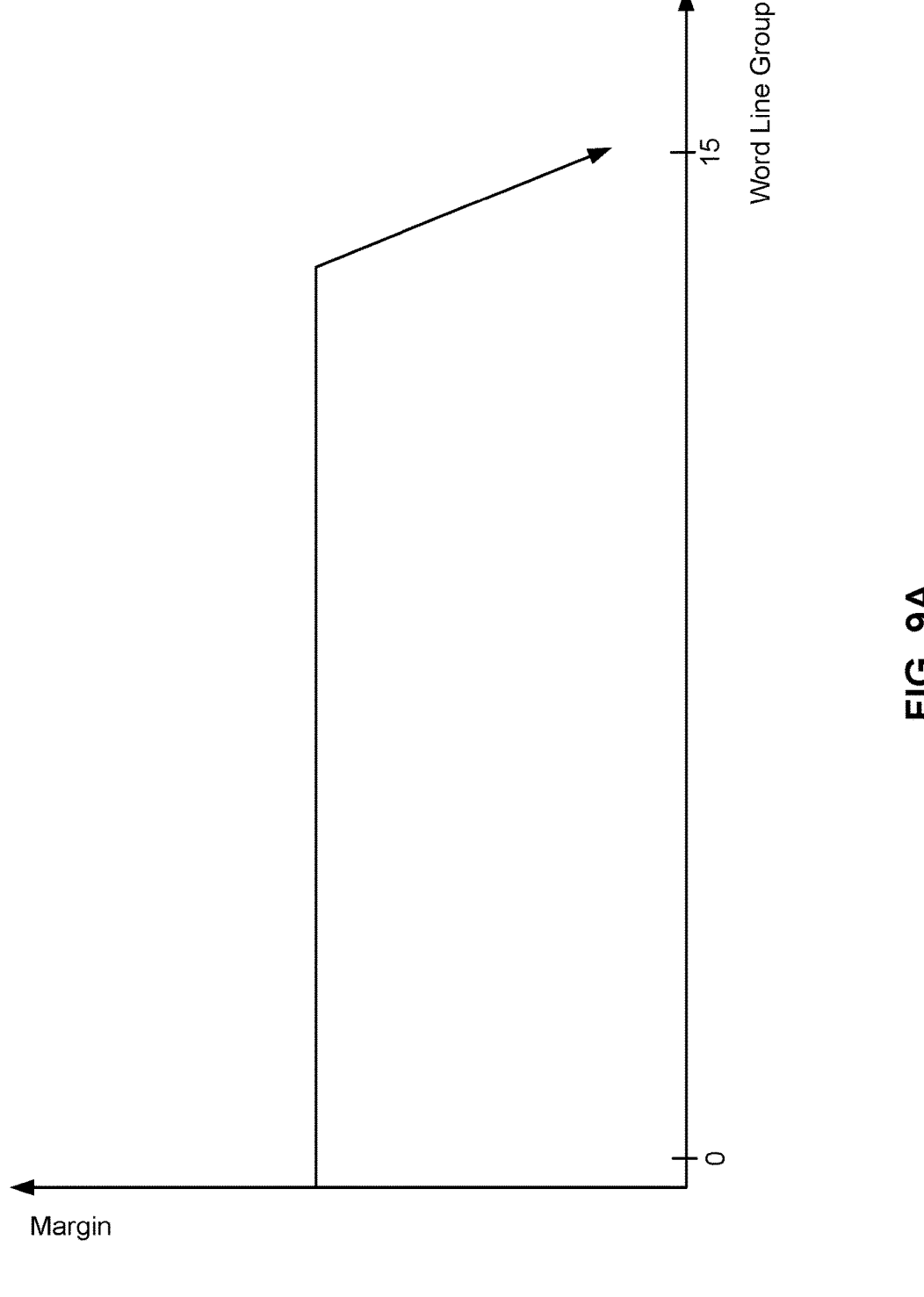
FIGS. 9A and 9B are diagrams of examples of erased threshold voltage margin for a plurality of word line groups of a block of the memory described herein.
Figure 9B:
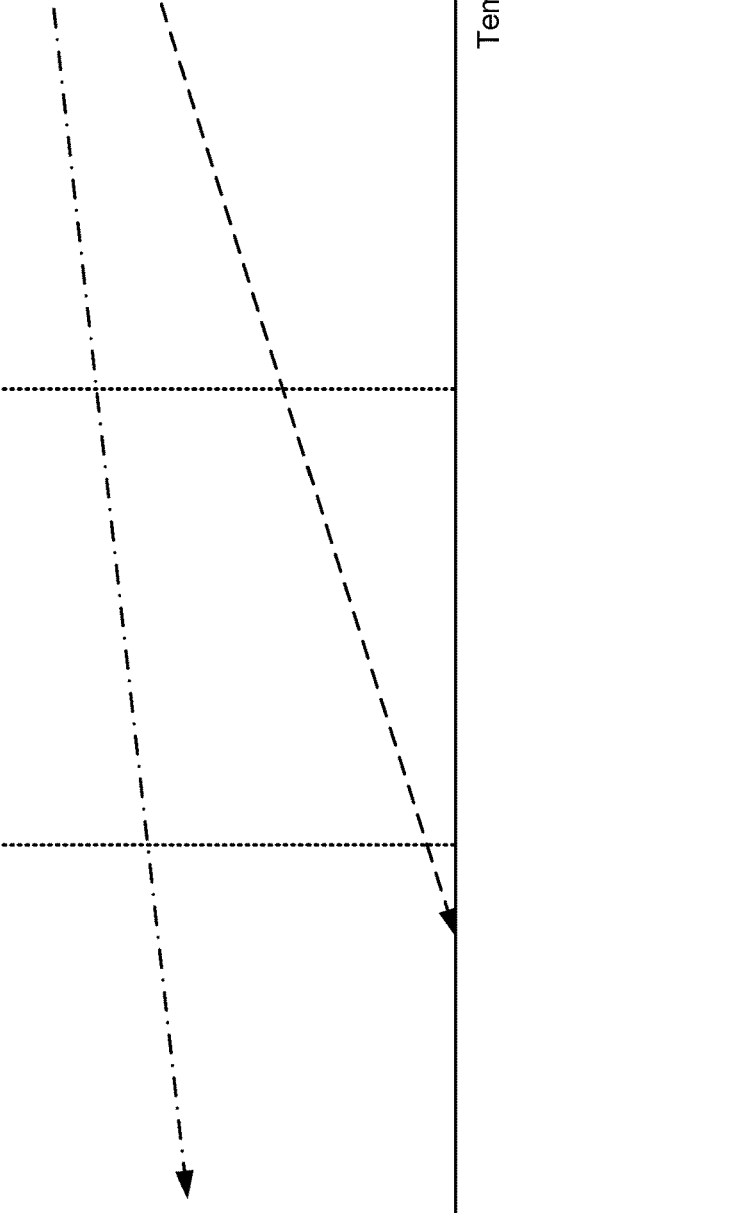

FIGS. 9A and 9B are diagrams of examples of erase threshold voltage margin for a plurality of word line groups 0-15 of a block of the memory 140 described herein. As shown in the example 900 of FIG. 9A, the erase threshold voltage margin (Edge0) may be worst/lowest for memory cells located in the last word line group (e.g., word line group 15). The word line group 15 may be located in the bottom-most deck (e.g., DECK0) of the memory 140, and may experience the worst/lowest erase threshold voltage margin since the electric field strength for the DECK0 may be the highest electric field strength among DECK0-DECK31 of the memory 140. Accordingly, the offset voltage used for the word line group 15 in the DECK0 may be the lowest magnitude offset voltage of the word line groups 0-15 in the block. Moreover, in some cases, the controller 130 may perform an NDEP scan for only the word line group 15 in the block due to the word line group 15 having the worst/lowest erase threshold voltage margin.

The example 905 of FIG. 9B illustrates margin loss (e.g., the loss of erased threshold voltage margin) across different operating temperatures for word line group 0 & 15 (WLG0 and WLG15). As shown in FIG. 9B, the loss of erased threshold voltage margin may occur the most at the lowest operating temperatures for the memory 140, particularly in the word line group 15. Thus, the word line group 15 is the most affected by changes in operating temperature. The erased margin for the word line group 15 may decrease as the operating temperature of the memory 140 decreases. Accordingly, the magnitude of the offset voltage for the word line group 15 may decrease as the operating temperature of the memory 140 decreases.

As indicated above, FIGS. 9A and 9B are provided as examples. Other examples may differ from what is described with regard to FIGS. 9A and 9B.

Figure 10A:
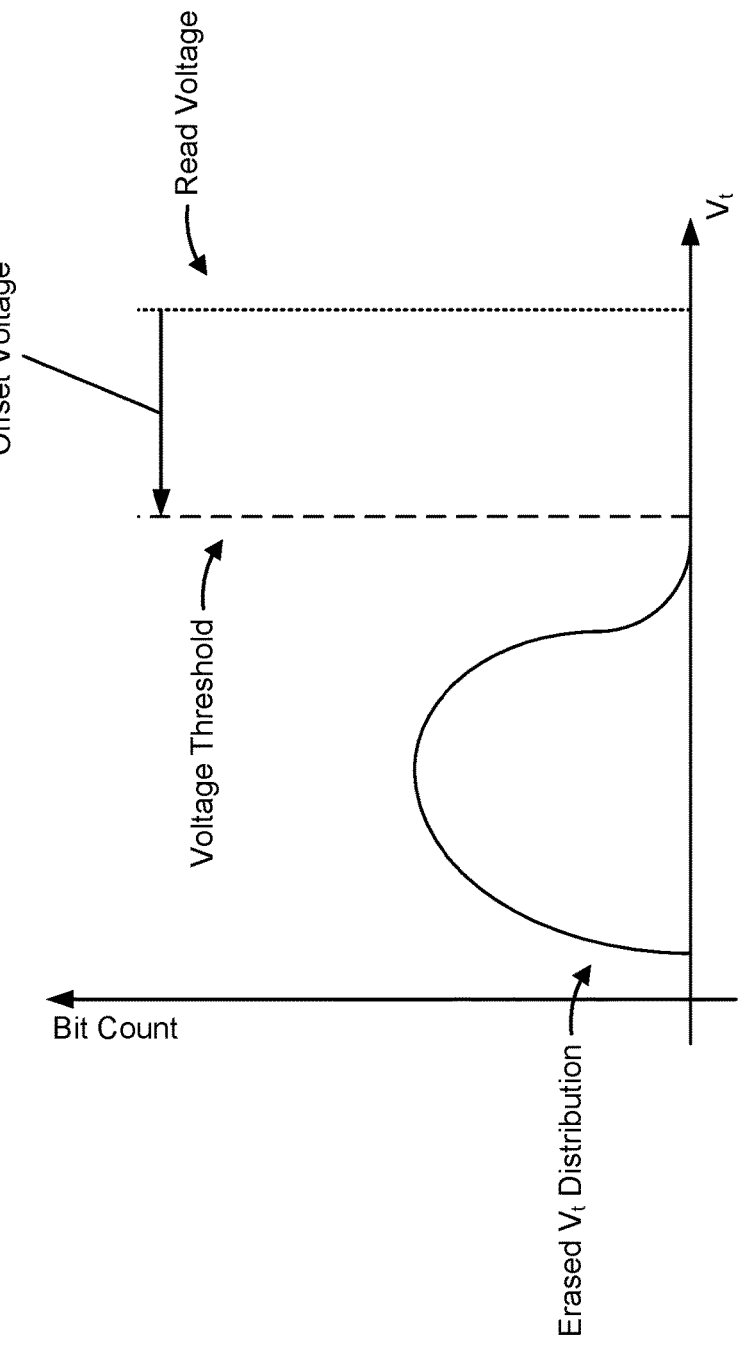
FIGS. 10A and 10B are diagrams of an example of a dynamic offset voltage for a word line group described herein.
Figure 10B:
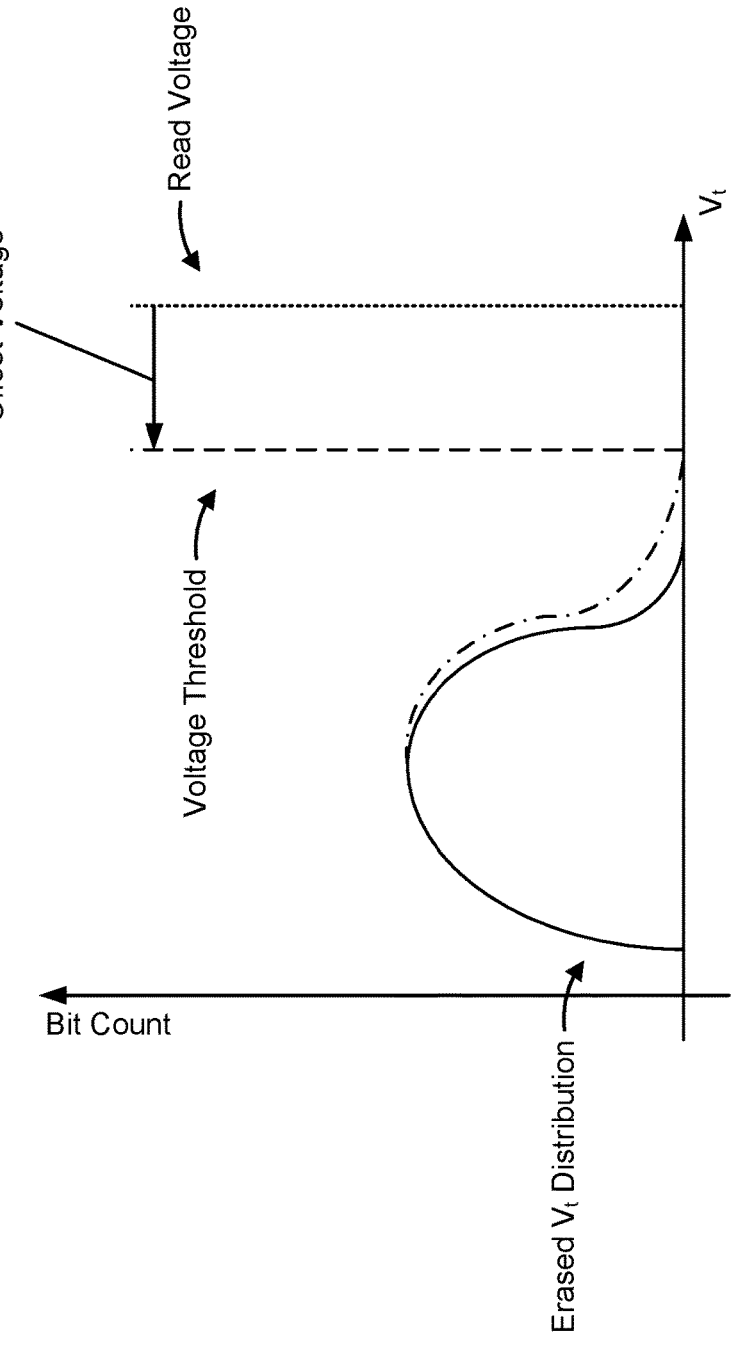

FIGS. 10A and 10B are diagrams of an example 1000 of a dynamic offset voltage for a word line group described herein. As shown in FIG. 10A, the offset voltage may be applied to the read voltage for the word line group to determine the voltage threshold. The voltage threshold may be shifted lower in voltage magnitude relative to the read voltage based on the offset voltage. As shown in FIG. 10B, the offset voltage may be reduced based on one or more parameters of the word line group such that the voltage threshold is greater in voltage magnitude to account for the greater erased threshold voltage distribution. In this way, the offset voltage and the resulting voltage threshold may be adaptive for different parameters and/or operating conditions of the word line group.

As indicated above, FIGS. 10A and 10B are provided as an example. Other examples may differ from what is described with regard to FIGS. 10A and 10B.

FIGS. 11A and 11B are diagrams of examples of look-up tables that may be used to identify an offset voltage described herein. FIG. 11A illustrates an example 1100 of a beginning of life (BOL) look-up table and FIG. 11B illustrates an example 1105 of an end of life (EOL) look-up table. As shown in FIGS. 11A and 11B, the magnitude of an offset voltage for an NDEP scan described herein may generally be greater for memory cells at or near BOL relative to memory cells at or near EOL for the same memory cell type and the same operating temperature. The offset values in a look-up table may be indicated as an analog value (e.g., in millivolts) or as a digital value that the controller 130 uses to determine the analog value based on a digital-to-analog conversion (DAC).

Within a particular look-up table (e.g., within a BOL look-up table, within an EOL look-up table), the magnitude of an offset voltage for an NDEP scan described herein may generally be higher for memory cells having fewer levels and may generally be lower for memory cells having a greater quantity of levels for the same operating temperature. For example, the magnitude of the offset voltage for an SLC memory cell at less than 0 degrees Celsius may be greater relative to the magnitude of the offset voltage for an MLC memory cell at less than 0 degrees Celsius, and the magnitude of the offset voltage for an MLC memory cell at less than 0 degrees Celsius may be greater relative to the magnitude of the offset voltage for a TLC memory cell at less than 0 degrees Celsius.

Within a particular memory cell type, the magnitude of an offset voltage for an NDEP scan described herein may generally be greater for lower operating temperatures relative to greater operating temperatures. For example, the magnitude of the offset voltage for an MLC memory cell at less than 0 degrees Celsius may be greater relative to the magnitude of the offset voltage for an MLC memory cell in a range of approximately 0 degrees Celsius to approximately 30 degrees Celsius, and the magnitude of the offset voltage for an MLC memory cell in a range of approximately 0 degrees Celsius to approximately 30 degrees Celsius may be greater relative to the magnitude of the offset voltage for an MLC memory cell at greater than 30 degrees Celsius.

As indicated above, FIGS. 11A and 11B are provided as examples. Other examples may differ from what is described with regard to FIGS. 11A and 111B.

FIG. 12 is a flowchart of an example method 1200 associated with an NDEP scan operation. In some implementations, a memory device (e.g., memory device 120) may perform or may be configured to perform one or more process blocks of FIG. 12. Additionally, or alternatively, one or more components of the memory device (e.g., the controller 130, the memory 140) may perform or may be configured to perform one or more process blocks of FIG. 12.

As shown in FIG. 12, the method 1200 may include identifying a plurality of word line groups, included in a block of a memory of the one or more components, that include erased pages of the block (block 1210). As further shown in FIG. 12, the method 1200 may include identifying a subset of word line groups, of the plurality of word line groups, for an NDEP scan operation (block 1220). As further shown in FIG. 12, the method 1200 may include performing, based on identifying the subset of word line groups, the NDEP scan operation for the subset of word line groups (block 1230).

Although FIG. 12 shows example blocks of a method 1200, in some implementations, the method 1200 may include additional blocks, fewer blocks, different blocks, or differently arranged blocks than those depicted in FIG. 12. Additionally, or alternatively, two or more of the blocks of the method 1200 may be performed in parallel. The method 1200 is an example of one method that may be performed by one or more devices described herein. These one or more devices may perform or may be configured to perform one or more other methods based on operations described herein, such as the operations described in connection with FIGS. 7-11B.

Figure 13:
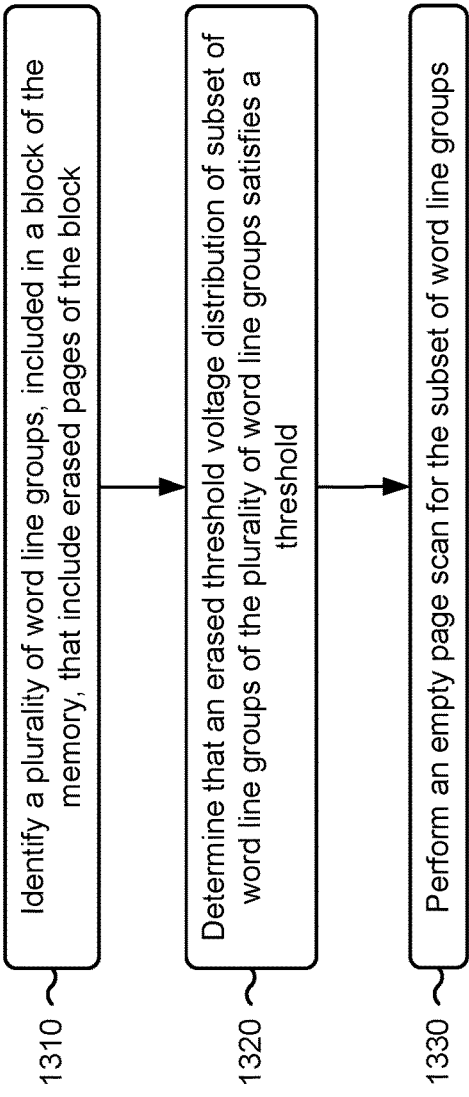
FIG. 13 is a flowchart of an example method associated with an NDEP scan operation.

FIG. 13 is a flowchart of an example method 1300 associated with an NDEP scan operation. In some implementations, a memory device (e.g., memory device 120) may perform or may be configured to perform one or more process blocks of FIG. 13. Additionally, or alternatively, one or more components of the memory device (e.g., the controller 130, the memory 140) may perform or may be configured to perform one or more process blocks of FIG. 13.

As shown in FIG. 13, the method 1300 may include identifying a plurality of word line groups, included in a block of the memory, that include erased pages of the block (block 1310). As further shown in FIG. 13, the method 1300 may include determining that an erase threshold voltage distribution of subset of word line groups of the plurality of word line groups satisfies a threshold (block 1320). As further shown in FIG. 13, the method 1300 may include performing an empty page scan for the subset of word line groups (block 1330).

Although FIG. 13 shows example blocks of a method 1300, in some implementations, the method 1300 may include additional blocks, fewer blocks, different blocks, or differently arranged blocks than those depicted in FIG. 13. Additionally, or alternatively, two or more of the blocks of the method 1300 may be performed in parallel. The method 1300 is an example of one method that may be performed by one or more devices described herein. These one or more devices may perform or may be configured to perform one or more other methods based on operations described herein, such as the operations described in connection with FIGS. 7-11B.

FIG. 14 is a flowchart of an example method 1400 associated with an NDEP scan operation. In some implementations, a memory device (e.g., memory device 120) may perform or may be configured to perform one or more process blocks of FIG. 14. Additionally, or alternatively, one or more components of the memory device (e.g., the controller 130, the memory 140) may perform or may be configured to perform one or more process blocks of FIG. 14.

As shown in FIG. 14, the method 1400 may include determining an offset voltage for an NDEP scan, wherein the offset voltage is determined based on one or more parameters associated with an erased page of a block included in a memory of the memory device (block 1410). As further shown in FIG. 14, the method 1400 may include determining a voltage threshold for the NDEP scan based on the offset voltage (block 1420). As further shown in FIG. 14, the method 1400 may include performing the NDEP scan for the erased page based on the voltage threshold (block 1430).

Although FIG. 14 shows example blocks of a method 1400, in some implementations, the method 1400 may include additional blocks, fewer blocks, different blocks, or differently arranged blocks than those depicted in FIG. 14. Additionally, or alternatively, two or more of the blocks of the method 1400 may be performed in parallel. The method 1400 is an example of one method that may be performed by one or more devices described herein. These one or more devices may perform or may be configured to perform one or more other methods based on operations described herein, such as the operations described in connection with FIGS. 7-11B.

In some implementations, a memory device includes one or more components configured to: identify a plurality of word line groups, included in a block of a memory of the one or more components, that include erased pages of the block; identify a subset of word line groups, of the plurality of word line groups, for an NDEP scan operation; and perform, based on identifying the subset of word line groups, the NDEP scan operation for the subset of word line groups.

In some implementations, a memory device includes a memory; and a controller configured to: identify a plurality of word line groups, included in a block of the memory, that include erased pages of the block; determine that an erased threshold voltage distribution of subset of word line groups of the plurality of word line groups satisfies a threshold; and perform an empty page scan for the subset of word line groups.

In some implementations, a method includes determining, by a controller of a memory device, an offset voltage for an NDEP scan, wherein the offset voltage is determined based on one or more parameters associated with an erased page of a block included in a memory of the memory device; determining, by the controller, a voltage threshold for the NDEP scan based on the offset voltage.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
   identify a plurality of word line groups, included in a block of a memory of the one or more components, that include erased pages of the block;
   determine, for a word line group of the plurality of word line groups, whether an erased threshold voltage of a tail portion of an erased threshold voltage distribution for the word line group satisfies a voltage threshold; and
   determine whether a NAND detect empty page (NDEP) scan operation passed or failed based on whether the erased threshold voltage of the tail portion of the erased threshold voltage distribution for the word line group satisfies the voltage threshold.

2. The memory device of claim 1,
   wherein the word line group has a lowest erased margin of the plurality of word line groups.

3. The memory device of claim 1,
   wherein the voltage threshold is based on one or more parameters associated with the word line group.

4. The memory device of claim 3,
   wherein the one or more parameters comprise:
   an operating temperature of memory cells associated with the word line group.

5. The memory device of claim 3,
   wherein the one or more parameters comprise:
   a quantity of program-erase cycles (PECs) that are accumulated for memory cells associated with the word line group.

6. The memory device of claim 3,
   wherein the one or more parameters comprise:
   a memory cell type of memory cells associated with the word line group.

7. The memory device of claim 3,
   wherein the one or more parameters comprise:

a location, in the memory, of memory cells associated with the word line group.

8. The memory device of claim 7, wherein the memory cells are located in a bottom-most deck in the memory.

9. The memory device of claim 1, wherein the one or more components are configured to:
    identify the word line group based upon a location, in the memory, of memory cells associated with the word line group.

10. A memory device, comprising:
a memory; and
a controller configured to:
    identify a plurality of word line groups, included in a block of the memory, that include erased pages of the block;
    test the plurality of word line groups to determine a respective charge gain for each word line group of the plurality of word line groups;
    determine that an erased threshold voltage distribution of a subset of word line groups of the plurality of word line groups satisfies a threshold based on the subset of word line groups being associated with a greatest amount of charge gain and the test; and
    perform an empty page scan for the subset of word line groups.

11. The memory device of claim 10, wherein memory cells associated with the subset of word line groups are located in a bottom-most deck in the memory.

12. The memory device of claim 10, wherein the controller is configured to:
    determine the threshold based on an operating temperature of memory cells associated with the plurality of word line groups.

13. The memory device of claim 10, wherein the controller is configured to:
    determine the threshold based on a quantity of program-erase cycles (PECs) accumulated for memory cells associated with the plurality of word line groups.

14. The memory device of claim 10, wherein the controller is configured to:
    determine the threshold based on a memory cell type for memory cells associated with the plurality of word line groups.

15. The memory device of claim 10, wherein the controller is configured to:
    determine an offset voltage for the subset of word line groups;
    determine a voltage threshold for the subset of word line groups based on the offset voltage; and perform the empty page scan to determine whether an erased threshold voltage for the subset of word line groups satisfies the voltage threshold.

16. The memory device of claim 15, wherein the controller is configured to:
    determine the offset voltage based on at least one of:
        an operating temperature of memory cells associated with the plurality of word line groups,
        a quantity of program-erase cycles (PECs) accumulated for the memory cells associated with the plurality of word line groups, or
        a memory cell type for the memory cells associated with the plurality of word line groups.

17. A method, comprising:
determining, by a controller of a memory device, an offset voltage for a NAND detect empty page (NDEP) scan,
    wherein the offset voltage is determined based on one or more parameters associated with an erased page of a block included in a memory of the memory device, and
    wherein a magnitude of the offset voltage decreases as a quantity of program-erase cycles (PECs) accumulated for memory cells associated with the erased page increases;
determining, by the controller, a voltage threshold for the NDEP scan based on the offset voltage; and
performing, by the controller, the NDEP scan for the erased page based on the voltage threshold.

18. The method of claim 17, wherein the one or more parameters comprise:
    an operating temperature of the erased page.

19. The method of claim 18, wherein a magnitude of the offset voltage increases as the operating temperature of the erased page increases.

20. The method of claim 17, wherein the one or more parameters comprise:
    the quantity of PECs.

21. The method of claim 17, wherein the one or more parameters comprise:
    a memory cell type of memory cells associated with the erased page.

22. The method of claim 17, wherein the one or more parameters comprise:
    a location, in the memory, of memory cells associated with the erased page.

23. The method of claim 17, wherein determining the voltage threshold comprises:
    applying the offset voltage to a read voltage of the erased page to determine the voltage threshold.

24. The method of claim 17, further comprising:
determining an erased threshold voltage threshold based on a memory cell type for one or more memory cells of the memory device.

* * * * *